(12) United States Patent
Schloesser et al.

(10) Patent No.: US 8,716,077 B2
(45) Date of Patent: May 6, 2014

(54) REPLACEMENT GATE COMPATIBLE EDRAM TRANSISTOR WITH RECESSED CHANNEL

(75) Inventors: Till Schloesser, Dresden (DE); Peter Baars, Dresden (DE); Frank Jakubowski, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 351 days.

(21) Appl. No.: 13/215,635

(22) Filed: Aug. 23, 2011

(65) Prior Publication Data

US 2013/0049103 A1  Feb. 28, 2013

(51) Int. Cl.
*H01L 21/336* (2006.01)
*H01L 21/8242* (2006.01)

(52) U.S. Cl.
USPC ........... 438/183; 438/259; 438/270; 438/275; 438/279; 438/286; 257/330; 257/332; 257/E29.321; 257/E21.444; 257/E21.453

(58) Field of Classification Search
USPC ......... 438/183, 197, 213, 216, 259, 261, 268, 438/270–271, 275, 279, 283, 286, 287; 257/202, 206, 284, 330–333, E21.621, 257/E21.625, E21.626, E21.637, E21.639, 257/E21.64, E29.264, E29.265, E29.275, 257/E29.319, E21.444, E21.453, E29.321
See application file for complete search history.

(56) References Cited

U.S. PATENT DOCUMENTS

| 8,193,582 | B2 * | 6/2012 | Matsubara | 257/334 |
| 8,283,222 | B2 * | 10/2012 | Hsu et al. | 438/183 |
| 8,330,227 | B2 * | 12/2012 | Hung et al. | 257/369 |
| 8,357,978 | B1 * | 1/2013 | Baars et al. | 257/368 |
| 8,552,490 | B2 * | 10/2013 | Huang et al. | 257/326 |
| 2003/0219953 | A1 * | 11/2003 | Mayuzumi | 438/353 |
| 2007/0082440 | A1 * | 4/2007 | Shiratake | 438/243 |
| 2009/0242980 | A1 * | 10/2009 | Inoue | 257/334 |
| 2010/0006932 | A1 * | 1/2010 | Matsubara | 257/334 |
| 2010/0276757 | A1 * | 11/2010 | Doyle et al. | 257/368 |
| 2011/0306196 | A1 * | 12/2011 | Hsu et al. | 438/591 |
| 2012/0153369 | A1 * | 6/2012 | Hwang | 257/296 |
| 2012/0223394 | A1 * | 9/2012 | Toh et al. | 257/384 |
| 2012/0313178 | A1 * | 12/2012 | Liao et al. | 257/368 |
| 2013/0015510 | A1 * | 1/2013 | Yan et al. | 257/288 |
| 2013/0062701 | A1 * | 3/2013 | Lee et al. | 257/369 |
| 2013/0065371 | A1 * | 3/2013 | Wei et al. | 438/294 |
| 2013/0126966 | A1 * | 5/2013 | Lui et al. | 257/330 |
| 2013/0146968 | A1 * | 6/2013 | Kim | 257/330 |
| 2013/0200451 | A1 * | 8/2013 | Yilmaz et al. | 257/331 |
| 2013/0234253 | A1 * | 9/2013 | Toh et al. | 257/368 |
| 2013/0240988 | A1 * | 9/2013 | Griebenow et al. | 257/333 |

* cited by examiner

*Primary Examiner* — Laura Menz
*Assistant Examiner* — Maliheh Malek
(74) *Attorney, Agent, or Firm* — Ditthavong Mori & Steiner, P.C.

(57) ABSTRACT

An eDRAM is fabricated including high performance logic transistor technology and ultra low leakage DRAM transistor technology. Embodiments include forming a recessed channel in a substrate, forming a first gate oxide to a first thickness lining the channel and a second gate oxide to a second thickness over a portion of an upper surface of the substrate, forming a first polysilicon gate in the recessed channel and overlying the recessed channel, forming a second polysilicon gate on the second gate oxide, forming spacers on opposite sides of each of the first and second polysilicon gates, removing the first and second polysilicon gates forming first and second cavities, forming a high-k dielectric layer on the first and second gate oxides, and forming first and second metal gates in the first and second cavities, respectively.

12 Claims, 3 Drawing Sheets

US 8,716,077 B2

REPLACEMENT GATE COMPATIBLE EDRAM TRANSISTOR WITH RECESSED CHANNEL

TECHNICAL FIELD

The present disclosure relates to embedded dynamic random-access memories (eDRAMs) including recessed channel DRAMs and replacement metal gates. The present disclosure is particularly applicable to eDRAMs in 28 nanometer (nm) technology nodes and beyond.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

Metal gate electrodes have evolved for improving the drive current by reducing polysilicon depletion. However, simply replacing polysilicon gate electrodes with metal gate electrodes may engender issues in forming the metal gate electrode prior to high temperature annealing to activate the source/drain implants, as at a temperature in excess of 900° C. This fabrication technique may degrade the metal gate electrode or cause interaction with the gate dielectric, thereby adversely impacting transistor performance.

Replacement gate techniques have been developed to address problems attendant upon substituting metal gate electrodes for polysilicon gate electrodes, for high performance logic for 28 nanometer (nm) technologies and beyond. For example, a polysilicon gate is used during initial processing until high temperature annealing to activate source/drain implants has been implemented. Subsequently, the polysilicon is removed and replaced with a metal gate.

In stand-alone dynamic random-access memories (DRAMs), recessed channel transistors, e.g., u-shaped or saddle shaped 3d-transistors, have been employed for their superior retention behavior. The recessed channel creates an enlarged effective channel length, which in turn improves the relationship between off-state channel leakage ($I_{off}$) and gate-induced drain leakage current. The reduced leakage current corresponds to the static and dynamic retention characteristics of a DRAM chip, providing longer retention time than a conventional local-damascene FinFET.

Embedded DRAMs, or eDRAMs, integrate memory and logic on a single chip. Since eDRAMs reduce both total chip count in a system and also power consumption while increasing performance, they are particularly useful for system-on-chip (SoC) designs, which may additionally include other types of transistors, such as high voltage transistors. However, the recessed channel transistors used for DRAMs and the replacement gate transistors used for high performance logic are formed by different processes.

A need therefore exists for methodology enabling combining high performance logic transistor technology and ultra low leakage DRAM transistor technology for embedded DRAM or system-on-chip (SoC), and the resulting device.

SUMMARY

An aspect of the present disclosure is a method of combining replacement metal gate technology with ultra low leakage DRAM transistor technology.

Another aspect of the present disclosure is an eDRAM including a recessed channel transistor and replacement metal gate electrodes.)

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a recessed channel in a substrate; forming a first gate oxide to a first thickness lining the channel and second gate oxide to a second thickness over a portion of an upper surface of the substrate; forming a first polysilicon gate having a first portion in the recessed channel and a second portion overlying the first portion, above the upper surface of the substrate; forming a second polysilicon gate on the second gate oxide; forming first spacers on opposite sides of the second portion of the first polysilicon gate and second spacers on opposite sides of the second polysilicon gate; removing the first and second polysilicon gates, forming first and second cavities respectively; forming a high-k dielectric layer on the first and second gate oxides; and forming first and second metal gates in the first and second cavities, respectively.)

Aspects of the present disclosure include the first thickness differing from the second thickness. Further aspects include forming a third gate oxide to a third thickness over a second portion of the upper surface of the substrate; forming a third polysilicon on the third gate oxide; forming third spacers on opposite sides of the third polysilicon gate; removing the third polysilicon gate, forming a third cavity; forming the high-k dielectric layer on the third gate oxide; and forming a third metal gate in the third cavity, wherein the first thickness is less than the second thickness, but greater than the third thickness. Another aspect includes forming an interlayer dielectric (ILD) over the first, second, and third polysilicon gates, the first, second, and third spacers, and the substrate; and planarizing the ILD, gates, and spacers to be substantially coplanar, prior to removing the first, second, and third polysilicon gates. Additional aspects include forming the first, second, and third polysilicon gates to a height of 40 nanometers (nm) to 80 nm above the upper surface of the substrate. Other aspects include forming the second portion of the first polysilicon gate to a width less than a width of the first portion, for example by overetching the polysilicon by 5 nm to 20 nm. Further aspects include forming the first gate oxide to a thickness of 1 nm to 2 nm; forming the second gate oxide to a thickness of 2 nm to 4 nm; and forming the third gate oxide to a thickness of 0.5 nm to 1 nm. Additional aspects include forming the first, second, and third metal gates by: depositing a work function metal in the first, second, and third cavities; and filling the first, second, and third cavities with metal. Other aspects include, prior to forming the ILD: performing source/drain extension implants on opposite sides of each polysilicon gate; performing source/drain implants to form source/drain regions on opposite sides of each polysilicon gate; annealing; and forming a silicide over the source/drain regions on opposite sides of each polysilicon gate. Further aspects include depositing additional gate oxide for at least one of the first, second, and third gate oxides; and thinning the at least one gate oxide subsequent to removing the first, second, and third polysilicon gates.

Another aspect of the present disclosure is a device including a substrate; a recessed channel in the substrate; a first gate oxide at a first thickness lining the recessed channel; a second gate oxide at a second thickness over a portion of the substrate; a high-k dielectric layer on the first and second gate oxides; a first replacement metal gate having a first portion filling the recessed channel and a second portion overlying the first portion; a second replacement metal gate over the second gate oxide; and first spacers on opposite sides of the second portion of the first metal gate and second spacers on opposite sides of the second metal gate, wherein the first thickness differs from the second thickness.

Aspects include a device including a third gate oxide at a third thickness over a second portion of the substrate; a high-k dielectric layer on the third gate oxide; a third replacement metal gate over the third gate oxide; third spacers on opposite sides of the third metal gate, wherein the first thickness is less than the second thickness but greater than the third thickness. Further aspects include a device wherein a width of the second portion of the first metal gate is less than a width of the recessed channel, for example by 5 nm to 20 nm. Another aspect includes a device wherein the second portion of the first metal gate, the second metal gate, and the third metal gate are formed to a height of 40 nm to 80 nm. Additional aspects include a device including source/drain extensions and source/drain regions in the substrate on opposite sides of each polysilicon gate; and a silicide over the source/drain implant regions. Other aspects include a device including an interlayer dielectric (ILD) over the silicide and the substrate, having an upper surface substantially coplanar with an upper surface of the first, second, and third metal gates.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
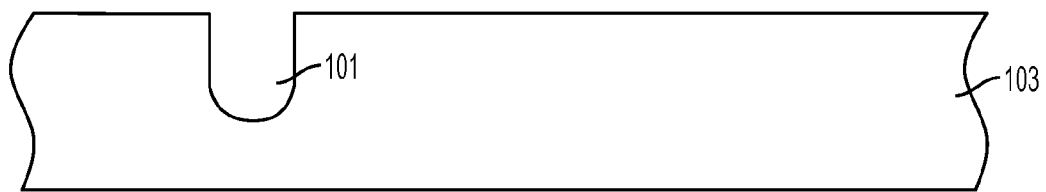
FIGS. 1A through 1G schematically illustrate a process flow for fabricating an eDRAM, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of combining high performance logic transistor technology and ultra low leakage DRAM transistor technology attendant upon fabricating an eDRAM. In accordance with embodiments of the present disclosure, a recessed channel is formed in a substrate, multiple gate oxides are formed on the substrate and in the recessed channel, and a replacement metal gate process is performed on each gate oxide, with the gate formed in the recessed channel extending above the substrate surface.

Methodology in accordance with embodiments of the present disclosure includes: forming a recessed channel in a substrate, forming a first gate oxide to a first thickness lining the channel and second gate oxide to a second thickness over a portion of an upper surface of the substrate, forming a first polysilicon gate having a first portion in the recessed channel and a second portion overlying the first portion, above the upper surface of the substrate, forming a second polysilicon gate on the second gate oxide, forming first spacers on opposite sides of the second portion of the first polysilicon gate and second spacers on opposite sides of the second polysilicon gate, removing the first and second polysilicon gates, forming first and second cavities respectively, forming a high-k dielectric layer on the first and second gate oxides, and forming first and second metal gates in the first and second cavities, respectively.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1G schematically illustrate a process flow for fabricating an eDRAM, in accordance with an exemplary embodiment. Adverting to FIG. 1A, subsequent to a conventional shallow trench isolation process and well and $V_t$ implants (not shown for illustrative convenience), a recessed channel 101 is formed in a substrate 103. The recessed channel may be formed by lithography and etching, wherein the lithographic mask may, for example, be a line or hole layout, depending on the DRAM layout, and the channel may, for example, be a trench. The recessed channel may be formed to a width of 50 nm or less. The transistor shape is determined by etch selectivity; silicon (Si) that is selective to silicon dioxide ($SiO_2$) will result in a pure recessed channel transistor, whereas a saddle shaped transistor, which is more like a FinFET, results from a faster $SiO_2$ etch rate.

Figure 1B:
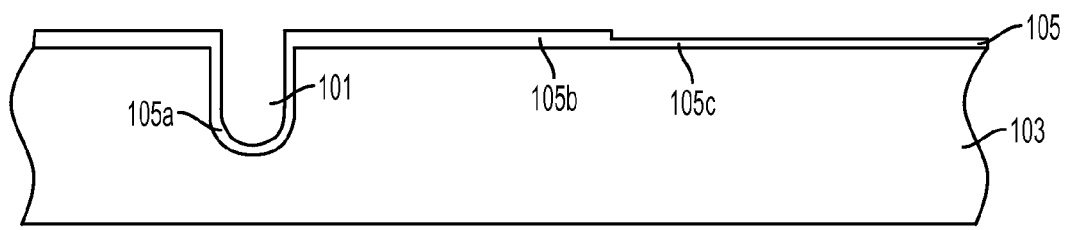

As illustrated in FIG. 1B, multiple gate oxides 105 may be grown or deposited over substrate 103, including in recessed channel 101, for forming different types of transistors on the same chip. For example, gate oxide 105a, formed in recessed channel 101, for a DRAM transistor, may be grown or deposited to a thickness of 1 nm to 2 nm. Gate tunneling effects may occur with thicknesses less than 1 nm, thereby degrading data retention in the memory portion. A thick gate oxide 105b may be deposited or grown to a thickness greater than 2 nm, for example 2 nm to 4 nm, for forming access transistors and I/O circuitry. A thin gate oxide 105c, less than 1 nm, for example 0.5 nm to 1 nm, may be formed by chemical oxidation or nitridation, for high speed logic transistors.

Figure 1C:
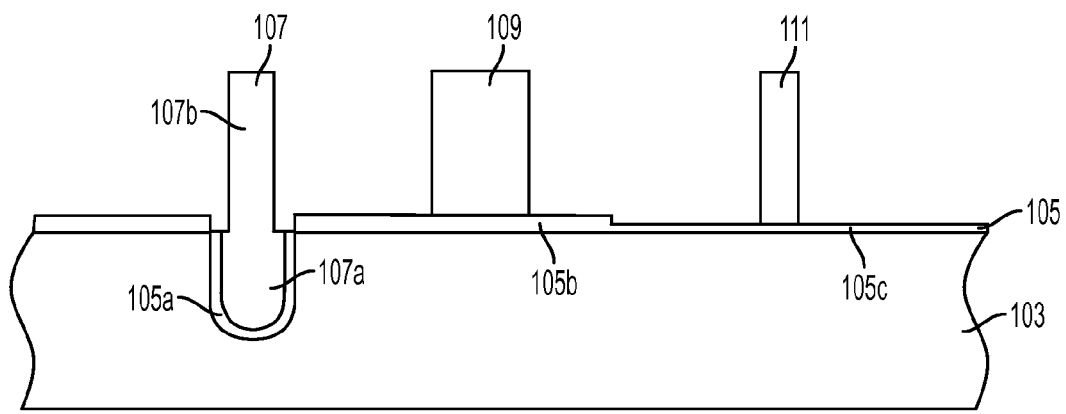

Polysilicon may then be deposited in recessed channel 101 and over substrate 103 and then etched to form polysilicon gates 107, 109, and 111, as illustrated in FIG. 1C. The polysilicon may optionally be predoped. Polysilicon gates 107, 109, and 111 may be formed to a height of 40 nm to 80 nm above the surface of substrate 103. Further, the polysilicon overlying recessed channel 101 may be overetched such that the width of the polysilicon above substrate 103 is 5 nm to 20 nm less than the width of the polysilicon in recessed channel 101. Polysilicon gate 109 is formed on gate oxide 105b, and polysilicon gate 111 is formed on gate oxide 111.

Figure 1D:
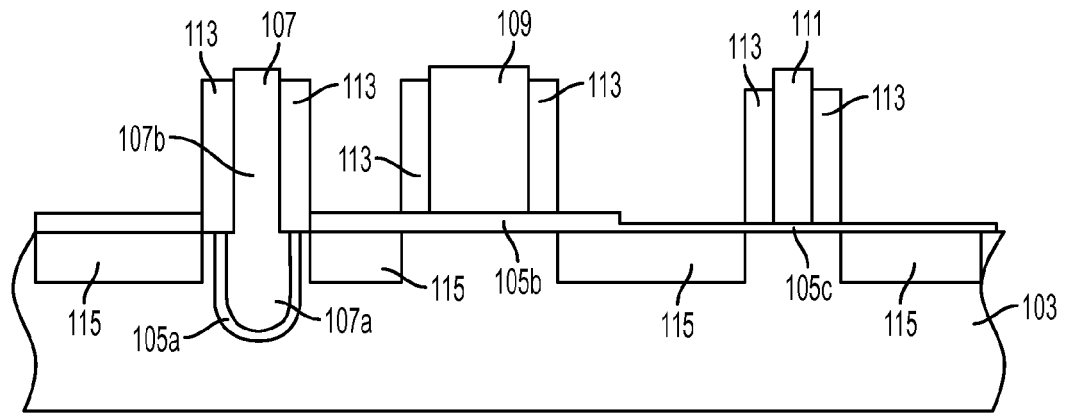

Adverting to FIG. 1D, spacers 113 may then be formed by conventional techniques on opposite sides of each of polysilicon gates 107, 109, and 111. Substrate 103 may be lightly doped to form source/drain extension (not shown for illustrative convenience) and further doped to form source/drain regions 115 on opposite sides of each of polysilicon gates 107, 109, and 111. The implants may be activated by performing an anneal, for example a rapid thermal anneal (RTA). In addition, silicon germanium (SiGe) may be applied in the formation of the source/drain extensions for improved stress.

Figure 1E:
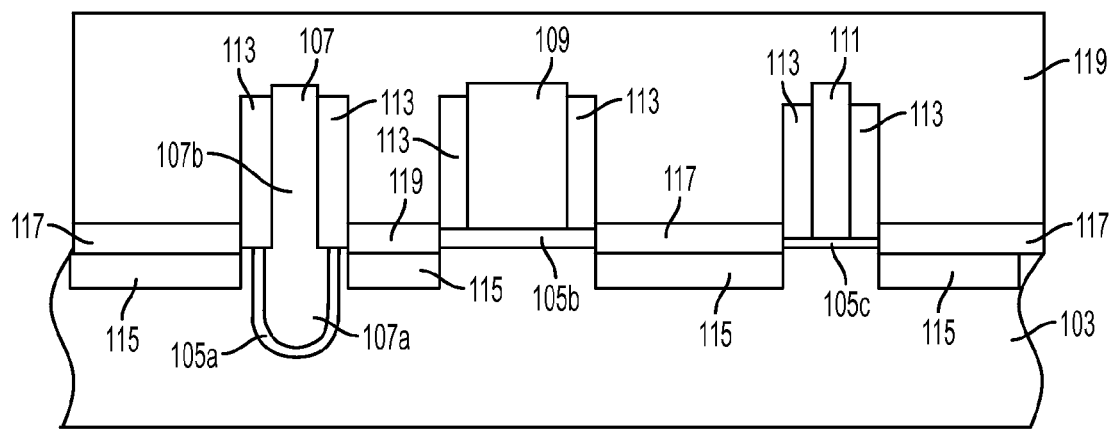

As illustrated in FIG. 1E, exposed gate oxide 105 may be removed, and a silicide 117 may be formed over source/drain regions 115. An ILD 119 may then be deposited over the entire substrate.

Figure 1F:
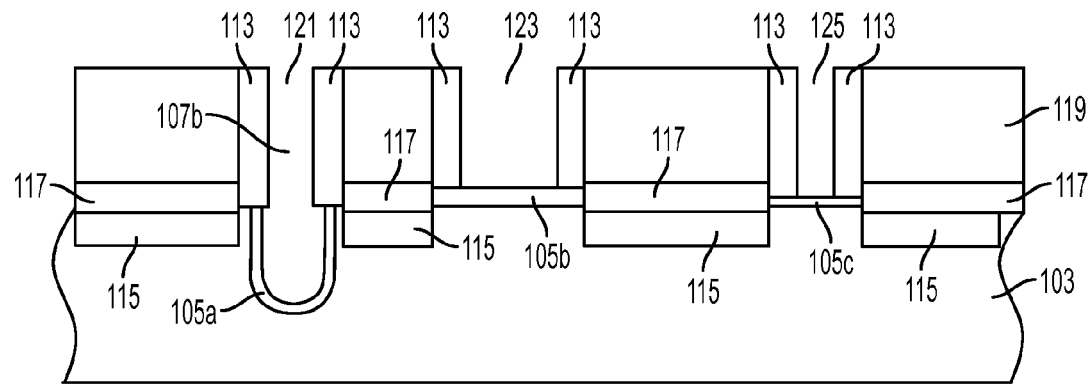

ILD 119, spacers 113, and polysilicon gates 107, 109, and 111 may then be planarized, for example by chemical mechanical polishing (CMP), as illustrated in FIG. 1F. Polysilicon gates 107, 109, and 111 are then removed by etching, for example with tetramethylammonium hydroxide (TMAH) or by a dry/wet etching process, forming cavities 121, 123, and 125, respectively. Gate oxide 105a, 105b, and/or 105c may be formed to a greater thickness than the target thickness described with respect to FIG. 1B, to act as an etch stop when the polysilicon is etched. In that case, the gate oxides may be thinned, carefully, subsequent to the polysilicon removal to reach the target thicknesses.

Figure 1G:
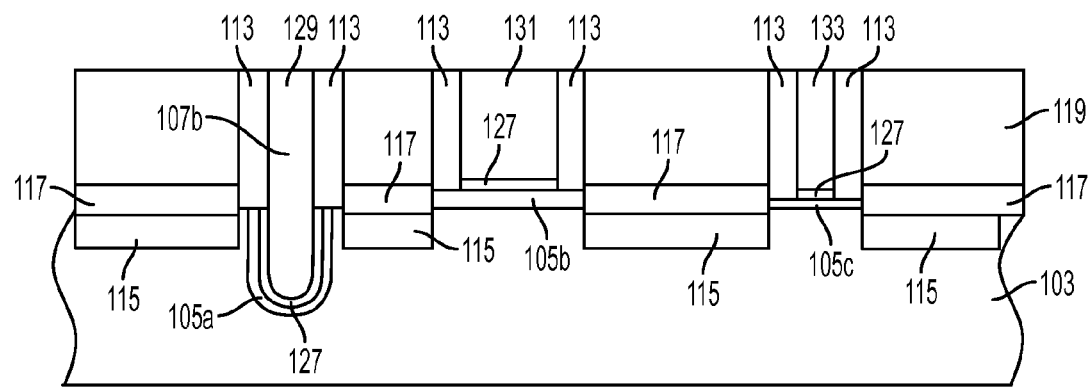

Adverting to FIG. 1G, a high-k dielectric layer 127, for example hafnium oxide or hafnium silicate, is deposited on gate oxides 105a, 105b, and 105c in cavities 121, 123, and 125, respectively. A work function metal (not shown for illustrative convenience) is then deposited in each cavity, followed by a metal fill, for example aluminum, to form metal electrodes 129, 131, and 133, respectively, thereby completing the replacement metal gate process flow. The work function metal may be a dual metal, e.g. titanium or tantalum containing with different amounts of oxygen or nitrogen, with a lithography step and metal strip in between the two metals. Although voids are possible in the recessed channel transistor gate, they cause no problems so as long as the first metal is deposited by atomic layer deposition (ALD) with good step coverage. After another CMP, further eDRAM processing may proceed, such with the formation of contacts, capacitors, metal lines, etc.

The embodiments of the present disclosure can achieve several technical effects, including high performance due to the use of replacement metal gates and ultra low leakage due to the recessed channel DRAM transistor. The present disclosure enjoys industrial applicability in any of various types of highly integrated semiconductor devices including eDRAMS and SoCs, particularly 28 nm devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a recessed channel by forming a trench in a substrate;
    forming a first gate oxide to a first thickness lining the channel and second gate oxide to a second thickness over a portion of an upper surface of the substrate, wherein the first thickness differs from the second thickness;
    forming a first polysilicon gate having a first portion in the trench and a second portion overlying the first portion, above the upper surface of the substrate;
    forming a second polysilicon gate on the second gate oxide;
    forming first spacers on opposite sides of the second portion of the first polysilicon gate and second spacers on opposite sides of the second polysilicon gate;
    removing the first and second polysilicon gates, forming first and second cavities respectively;
    forming a high-k dielectric layer on the first and second gate oxides; and
    forming first and second metal gates in the first and second cavities, respectively.

2. The method according to claim 1, further comprising:
    forming a third gate oxide to a third thickness over a second portion of the upper surface of the substrate;
    forming a third polysilicon gate on the third gate oxide;
    forming third spacers on opposite sides of the third polysilicon gate;
    removing the third polysilicon gate, forming a third cavity;
    forming the high-k dielectric layer on the third gate oxide; and
    forming a third metal gate in the third cavity,
    wherein the first thickness is less than the second thickness, but greater than the third thickness.

3. The method according to claim 2, further comprising:
    forming an interlayer dielectric (ILD) over the first, second, and third polysilicon gates, the first, second, and third spacers, and the substrate; and
    planarizing the ILD, gates, and spacers to be substantially coplanar, prior to removing the first, second, and third polysilicon gates.

4. The method according to claim 3, comprising forming the first, second, and third polysilicon gates to a height of 40 nanometers (nm) to 80 nm above the upper surface of the substrate.

5. The method according to claim 3, further comprising forming the second portion of the first polysilicon gate to a width less than a width of the first portion.

6. The method according to claim 5, comprising forming the second portion of the first polysilicon gate by overetching the polysilicon by 5 nm to 20 nm.

7. The method according to claim 3, further comprising:
    forming the first gate oxide to a thickness of 1 nm to 2 nm;
    forming the second gate oxide to a thickness of 2 nm to 4 nm; and
    forming the third gate oxide to a thickness of 0.5 nm to 1 nm.

8. The method according to claim 3, comprising forming the first, second, and third metal gates by:

depositing a work function metal in the first, second, and third cavities; and filling the first, second, and third cavities with metal.

9. The method according to claim 3, further comprising, prior to forming the ILD:
performing source/drain extension implants on opposite sides of each polysilicon gate;
performing source/drain implants on opposite sides of each polysilicon gate to form source/drain regions;
annealing; and
forming a silicide over the source/drain implants on opposite sides of each polysilicon gate.

10. The method according to claim 9, further comprising:
depositing additional gate oxide for at least one of the first, second, and third gate oxides; and
thinning the at least one gate oxide subsequent to removing the first, second, and third polysilicon gates.

11. A method comprising:
forming a recessed channel in a substrate;
depositing a first gate oxide to a first thickness of 1 nm to 2 nm lining the channel;
depositing a second gate oxide to a second thickness of 2 nm to 4 nm over a portion of an upper surface of the substrate;
depositing a third gate oxide to a third thickness of 0.5 nm to 1 nm, over another portion of an upper surface of the substrate;
forming a first polysilicon gate having a first portion in the recessed channel and a second portion overlying the first portion, above the upper surface of the substrate, and etching the polysilicon in the first portion to a width 5 nm to 20 nm less than a width of the second portion;
forming a second polysilicon gate on the second gate oxide and a third polysilicon gate on the third gate oxide;
forming first spacers on opposite sides of the second portion of the first polysilicon gate, second spacers on opposite sides of the second polysilicon gate, and third spacers on opposite sides of the third polysilicon gate;
forming an interlayer dielectric (ILD) over the first, second, and third polysilicon gates, the first, second, and third spacers, and the substrate;
planarizing the ILD, gates, and spacers to be substantially coplanar;
removing the first, second, and third polysilicon gates, forming first, second, and third cavities respectively;
forming a high-k dielectric layer on the first, second, and third gate oxides; and
forming first, second, and third metal gates in the first, second, and third cavities, respectively.

12. A method according to claim 11, further comprising:
depositing additional gate oxide for at least one of the first, second, and third gate oxides; and
thinning the at least one gate oxide subsequent to removing the first, second, and third polysilicon gates.

* * * * *